United States Patent
Kim

(10) Patent No.: US 9,934,751 B2
(45) Date of Patent: Apr. 3, 2018

(54) DISPLAY DEVICE

(71) Applicant: SAMSUNG DISPLAY CO., LTD., Yongin-si, Gyeonggi-do (KR)

(72) Inventor: Keunwoo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 42 days.

(21) Appl. No.: 15/238,552

(22) Filed: Aug. 16, 2016

(65) Prior Publication Data

US 2017/0193955 A1 Jul. 6, 2017

(30) Foreign Application Priority Data

Jan. 4, 2016 (KR) ........................ 10-2016-0000546

(51) Int. Cl.
*G09G 3/36* (2006.01)
*H01L 27/12* (2006.01)
*H01L 29/786* (2006.01)

(52) U.S. Cl.
CPC ......... *G09G 3/3688* (2013.01); *H01L 27/124* (2013.01); *H01L 27/1222* (2013.01); *H01L 27/1255* (2013.01); *H01L 29/7869* (2013.01); *H01L 29/78669* (2013.01); *G09G 2300/0413* (2013.01); *G09G 2300/0426* (2013.01); *G09G 2300/0452* (2013.01); *G09G 2310/08* (2013.01); *G09G 2320/0261* (2013.01); *G09G 2330/021* (2013.01)

(58) Field of Classification Search
CPC ......... G09G 3/3677; G09G 2310/0286; G09G 3/3688; G09G 2310/0267; G09G 3/3674; G09G 3/3266; G09G 2310/0205

USPC .................................................... 345/99, 100
See application file for complete search history.

(56) References Cited

U.S. PATENT DOCUMENTS 6,169,532 B1 * 1/2001 Sumi .................... G09G 3/2011
345/212
9,520,411 B2 * 12/2016 Takahashi ........... H01L 27/1225
(Continued)

FOREIGN PATENT DOCUMENTS

KR 10-2007-0082414 A 8/2007
KR 10-2007-0101033 A 10/2007
(Continued)

OTHER PUBLICATIONS

Liao et al., "Design of Integrated Amorphous-Silicon Thin-Film Transistor Gate Driver," Journal of Display Technology, vol. 9, No. 1, Jan. 2013, pp. 7-16.
(Continued)

*Primary Examiner* — Koosha Sharifi-Tafreshi
(74) *Attorney, Agent, or Firm* — Lewis Roca Rothgerber Christie LLP

(57) ABSTRACT

A display device includes a display panel, a gate driving circuit, and an image determination unit. The gate driving circuit includes a double gate transistor. The image determination unit outputs an image determination signal to a second control electrode of the double gate transistor. When the display panel displays a still image, the double gate transistor is turned on by the image determination signal so that each of gate signals outputted from stages connected in cascade to a stage including the double gate transistor among stages included in the gate driving circuit has a gate-off voltage.

20 Claims, 12 Drawing Sheets

(56) References Cited

U.S. PATENT DOCUMENTS

2007/0146289 A1* 6/2007 Lee .................. G09G 3/3677
345/100
2010/0033455 A1 2/2010 Kwak et al.
2010/0039363 A1 2/2010 Lee et al.

FOREIGN PATENT DOCUMENTS

KR 10-2015-0086973 A 7/2015
KR 10-2017-0065737 6/2017

OTHER PUBLICATIONS

Kim et al, "Double-Gate CMOS: Symmetrical- Versus Asymmetrical-Gate Devices," IEEE Transactions on Electron Devices, vol. 48, No. 2, Feb. 2001, pp. 294-299.

* cited by examiner

IEG9　ALG9　CEG9-1　CEG9-2　OEG9

TRG9

DISPLAY DEVICE

CROSS-REFERENCE TO RELATED APPLICATIONS

This application claims priority to, and the benefit of, Korean Patent Application No. 10-2016-0000546, in the Korean Intellectual Property Office, filed on Jan. 4, 2016, the entire content of which is herein incorporated by reference.

BACKGROUND

1. Field of Disclosure

Aspects of the present disclosure herein relate to a display device including a gate driving circuit.

2. Description of the Related Art

A display device includes a plurality of gate lines, a plurality of data lines, and a plurality of pixels connected to the plurality of gate lines and the plurality of data lines. The display device includes a gate driving circuit for sequentially providing gate signals to the plurality of gate lines and a data driving circuit for outputting data signals to the plurality of data lines.

The gate driving circuit includes one shift register formed of a plurality of stages connected in cascade. Each of the plurality of stages includes a plurality of transistors that are operably connected to output a gate voltage to a corresponding gate line.

A display device displays videos and/or still images. In an effort to reduce the power consumption, display devices that drive a display panel at low frequency, when a still image is inputted, are currently under development.

SUMMARY

Aspects of embodiments of the present disclosure are directed toward a display device for reducing power consumption when displaying a still image without reducing the frequency of a clock signal applied to a gate driving circuit of the display device.

According to some embodiments of the inventive concept, there is provided a display device including: a display panel including a plurality of gate lines, a plurality of data lines, and a plurality of pixels connected to the plurality of gate lines and the plurality of data lines, the display panel being configured to display a video or a still image; a gate driving circuit including a plurality of stages configured to output a plurality of gate signals having a gate-on voltage and a gate-off voltage less than the gate-on voltage to the gate lines, at least one of the plurality of stages including a double gate transistor including an input electrode, an output electrode, a first control electrode, and a second control electrode; and an image determiner configured to output an image determination signal to the second control electrode of the double gate transistor, wherein when the display panel displays the video, the image determination signal has a first image determination voltage and when the display panel displays the still image, the image determination signal has a second image determination voltage greater than the first image determination voltage, wherein when the image determination signal has the second image determination voltage, the double gate transistor is turned on, so that a plurality of gate signals outputted from a plurality of stages connected in cascade to a stage including the double gate transistor among the plurality of stages have the gate-off voltage.

In an embodiment, the second image determination voltage is about 15 V or more and about 35 V or less, and the first image determination voltage is about −12 V or more and about −6 V or less.

In an embodiment, an ith stage (i being an integer greater than one) among the plurality of stages includes: a first output circuit configured to be turned on/off according to a voltage of a Q-node and to generate a gate signal of the plurality of gate signals outputted to a gate output terminal of the ith stage from a clock signal applied to an input terminal of the ith stage; a second output circuit configured to be turned on/off according to the voltage of the Q-node and to generate a carry signal outputted to a carry output terminal of the ith stage from the clock signal, the carry signal having a carry-on voltage and a carry-off voltage less than the carry-on voltage; a controller configured to control the voltage of the Q-node; a first pull-down circuit configured to provide a first low voltage to the gate output terminal to pull down a voltage of the gate signal to a gate off-voltage after the gate signal having the gate-on voltage is outputted to the gate output terminal; a second pull-down circuit configured to provide a second low voltage to the carry output terminal to pull down a voltage of the carry signal to the carry-off voltage after the carry signal having the carry-on voltage is outputted to the carry output terminal; a first holding circuit configured to be turned on/off according to a voltage of an A-node and to provide the first low voltage to the gate output terminal after the first low voltage is provided to the gate output terminal; a second holding circuit configured to be turned on/off according to the voltage of the A-node and to provide the second low voltage to the carry output terminal after the second low voltage is provided to the carry output terminal; and an inverter configured to control the voltage of the A-node.

In an embodiment, the gate-off voltage is substantially equal to the first low voltage, and the carry-off voltage is substantially equal to the second low voltage.

In an embodiment, the first low voltage is about −8 V or more and about −6 V or less, and the second low voltage is about −12 V or more and about −10 V or less.

In an embodiment, the second pull-down circuit includes the double gate transistor, and the output electrode of the double gate transistor is connected to the carry output terminal, and the first control electrode of the double gate transistor is connected to the Q-node.

In an embodiment, the controller includes the double gate transistor, and the output electrode of the double gate transistor is connected to the Q-node and the first control electrode of the double gate transistor is connected to the A-node.

In an embodiment, the first holding circuit includes the double gate transistor, and the output electrode of the double gate transistor is connected to the gate output terminal, and the first control electrode of the double gate transistor is configured to receive a gate signal or carry signal outputted from an (i+1)th stage of the plurality of stages.

In an embodiment, the second holding circuit includes the double gate transistor, the output electrode of the double gate transistor is connected to the carry output terminal, and the first control electrode of the double gate transistor is configured to receive a gate signal or carry signal outputted from an (i+1)th stage of the plurality of stages.

According to some embodiments of the inventive concept, there is provided a display device including: a display panel including a plurality of gate lines, a plurality of data lines, and a plurality of pixels connected to the plurality of gate lines and the plurality of data lines, the display panel being configured to display a video or a still image; and a gate driving circuit including a plurality of transistors and configured to output a plurality of gate signals to the plurality of gate lines, wherein at least one of the plurality of transistors is a double gate transistor including an input electrode, an output electrode, a first control electrode, and a second control electrode, wherein the input electrode of the double gate transistor is configured to receive a low voltage less than about 0 V, and wherein when the display panel displays the still image, the second control electrode of the double gate transistor is configured to receive a still image determination voltage is applied to turn on the double gate transistor.

In an embodiment, when the display panel displays the video, a video determination voltage less than the still image determination voltage is applied to the second control electrode.

In an embodiment, the low voltage less than about 0 V is about −12 V or more and about −6 V or less.

In an embodiment, the still image determination voltage is about 15 V or more and about 35 V or less, and the video determination voltage is about −12 V or more and about −6 V or less.

In an embodiment, the gate driving circuit includes a plurality of stages configured to output the plurality of gate signals to the gate lines and connected in cascade, wherein an ith stage (i being an integer greater than one) among the plurality of stages includes: a first output circuit configured to be turned on/off according to a voltage of a Q-node and to generate a gate signal of the plurality of gate signals outputted to a gate output terminal of the ith stage, the gate signal having a gate-on voltage and a gate-off voltage less than the gate-on voltage from a clock signal applied to an input terminal of the ith stage; a second output circuit configured to be turned on/off according to the voltage of the Q-node and to generate a carry signal outputted to a carry output terminal of the ith stage, the carry signal and having a carry-on voltage and a carry-off voltage less than the carry-on voltage from the clock signal; a controller configured to control the voltage of the Q-node; a first pull-down circuit configured to provide a first low voltage to the gate output terminal to pull down a voltage of the gate signal to a gate off-voltage after the gate signal having the gate-on voltage is outputted to the gate output terminal; a second pull-down circuit configured to provide a second low voltage to the carry output terminal to pull down a voltage of the carry signal to the carry-off voltage after the carry-on voltage is outputted to the carry output terminal; a first holding circuit configured to be turned on/off according to a voltage of an A-node and to provide the first low voltage to the gate output terminal after the first low voltage is provided to the gate output terminal; a second holding circuit configured to be turned on/off according to the voltage of the A-node and to provide the second low voltage to the carry output terminal after the second low voltage is provided to the carry output terminal; and an inverter configured to control the voltage of the A-node.

In an embodiment, the gate-off voltage is substantially equal to the first low voltage, and the carry-off voltage is substantially equal to the second low voltage.

In an embodiment, the second pull-down circuit includes the double gate transistor, and the low voltage less than about 0 V applied to the input electrode of the double gate transistor is substantially equal to the second low voltage, the output electrode of the double gate transistor is connected to the carry output terminal, and the first control electrode of the double gate transistor is connected to the Q-node.

In an embodiment, the controller includes the double gate transistor, and the low voltage less than about 0 V applied to the input electrode of the double gate transistor is substantially equal to the second low voltage, the output electrode of the double gate transistor is connected to the Q-node, and the first control electrode of the double gate transistor is connected to the A-node.

In an embodiment, the first holding circuit includes the double gate transistor, and the low voltage less than about 0 V applied to the input electrode of the double gate transistor is substantially equal to the first low voltage, the output electrode of the double gate transistor is connected to the gate output terminal, and the first control electrode of the double gate transistor is configured to receive the gate signal or the carry signal outputted from an (i+1)th stage of the plurality of stages.

In an embodiment, the second holding circuit includes the double gate transistor, the low voltage less than about 0 V applied to the input electrode of the double gate transistor is substantially equal to the first low voltage, the output electrode of the double gate transistor is connected to the carry output terminal, and the first control electrode of the double gate transistor is configured to receive the gate signal or the carry signal outputted from an (i+1)th stage of the plurality of stages.

According to some embodiments of the inventive concept, there is provided a display device including: a display panel including a plurality of gate lines, a plurality of data lines, and a plurality of pixels connected to the plurality of gate lines and the plurality of data lines, the display panel being configured to provide an image during a frame section including a plurality of frames, wherein the frame section includes a first section where a data voltage applied to the plurality of data lines is constant at each of a plurality of continuous frames and a second section where a data voltage applied to the plurality of data lines is changed at each of a plurality of continuous frames; a gate driving circuit including a plurality of transistors and configured to output a plurality of gate signals to the plurality of gate lines, a data driving circuit configured to output data signals to the plurality of data lines; and an image determination circuit configured to output an image determination signal having a still image determination voltage in the first section and a video determination voltage less than the still image determination voltage in the second section, wherein at least one of the plurality of transistors is a double gate transistor including an input electrode, an output electrode, a first control electrode and a second control electrode, wherein the input electrode of the double gate transistor is configured to receive a low voltage less than about 0 V, and wherein the second control electrode of the double gate transistor is configured to receive the image determination signal.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the inventive concept are described in more detail with reference to the accompanying drawings.

Figure 1A:
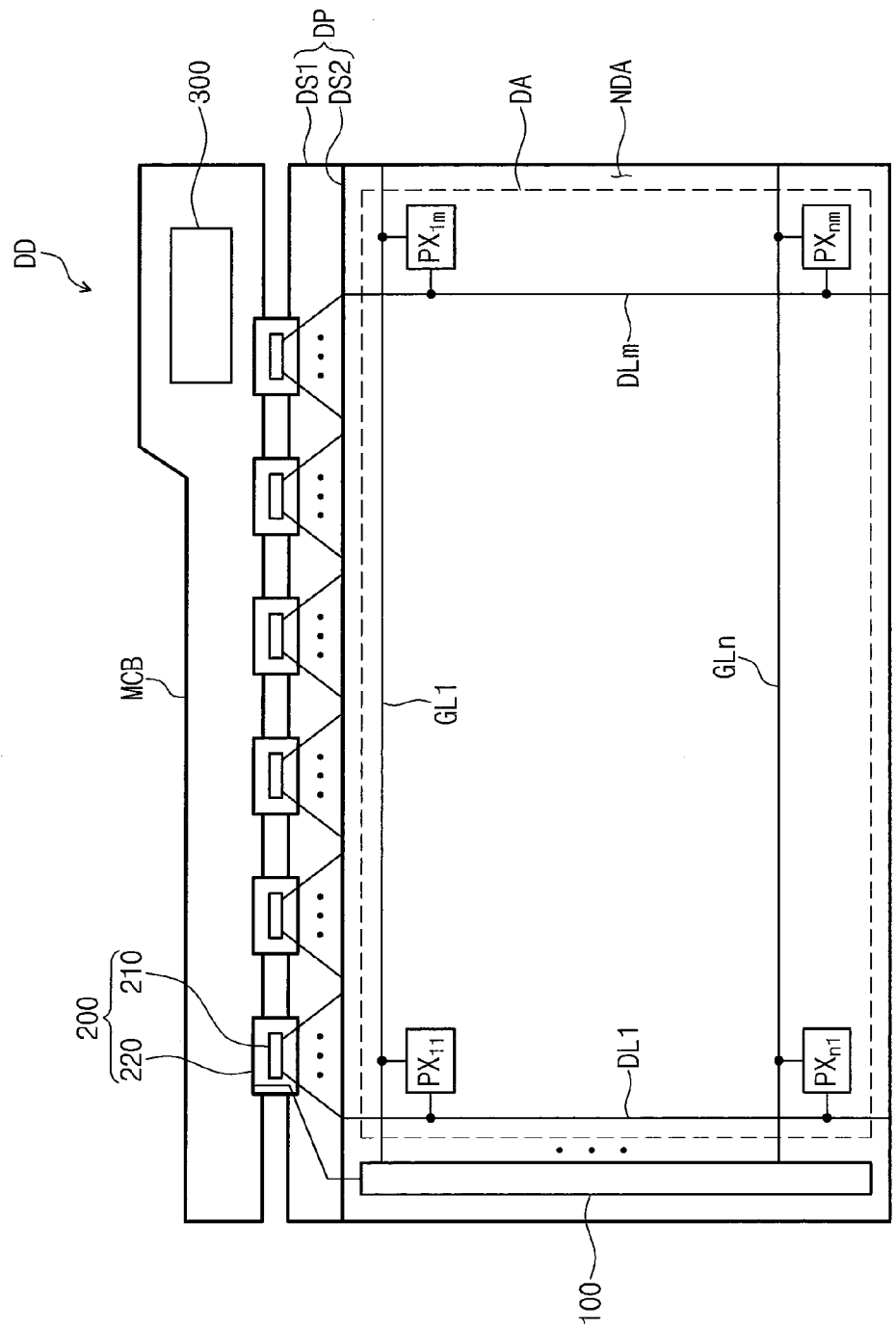
FIG. 1A is a block diagram illustrating a display device according to an embodiment of the inventive concept.
Figure 1B:
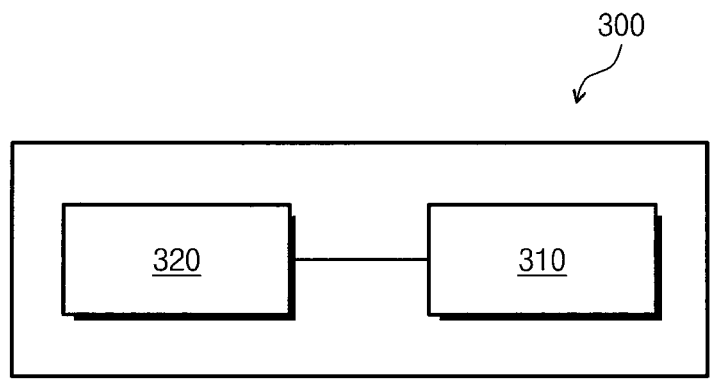
FIG. 1B is a block diagram illustrating an enlarged area AA shown in FIG. 1A.
Figure 2:
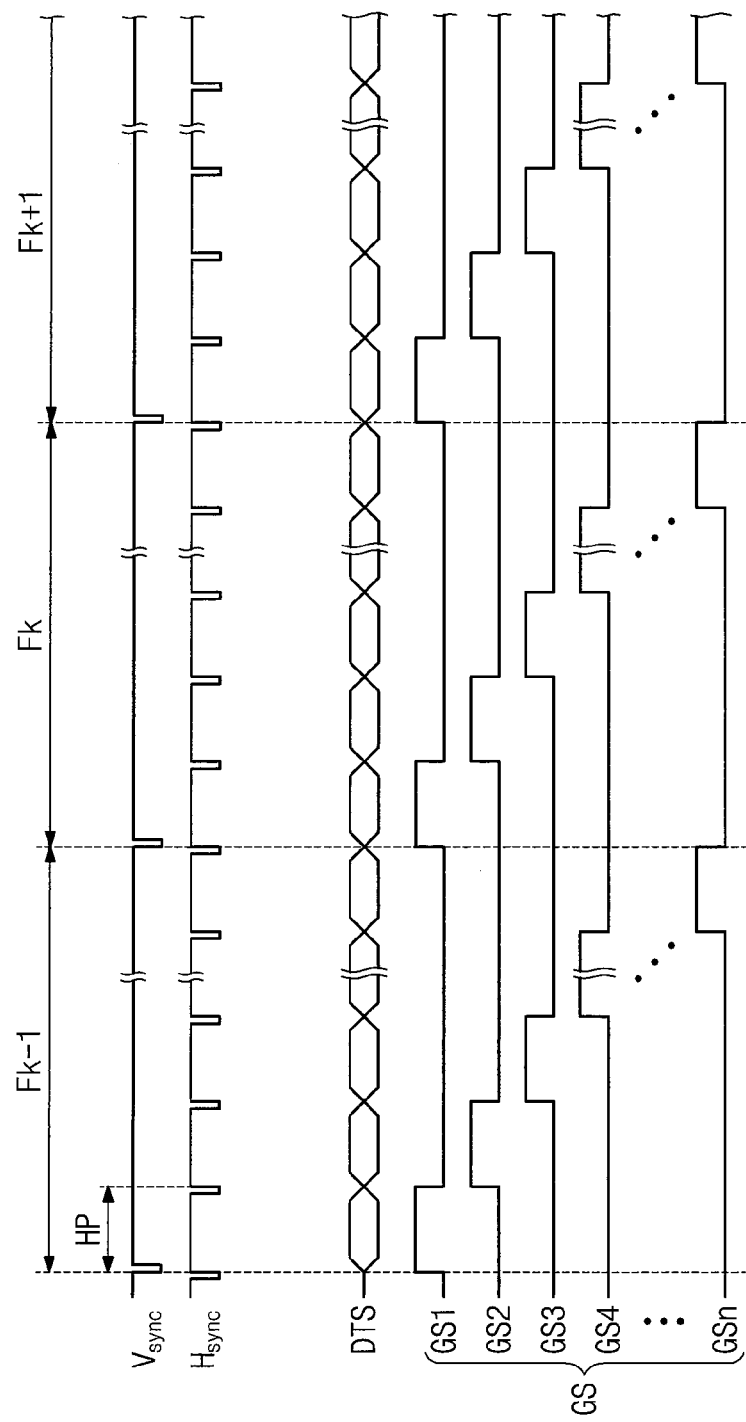
FIG. 2 is a timing diagram illustrating signals of a display device according to an embodiment of the inventive concept.

FIG. 1A is a plan view of a display device DD according to an embodiment of the inventive concept. FIG. 1B is a block diagram illustrating an enlarged area AA shown in FIG. 1. FIG. 2 is a timing diagram illustrating signals of a display device according to an embodiment of the inventive concept.

As shown in FIGS. 1A, 1B, and 2, the display device DD according to an embodiment of the inventive concept includes a display panel DP, a gate driving circuit 100, a data driving circuit 200, and a control voltage generation unit (e.g., a control voltage generator) 300.

The display panel DP is not limited to a specific embodiment of the inventive concept and may include various display panels such as a liquid crystal display panel, an organic light emitting display panel, an electrophoretic display panel, and an electrowetting display panel. In this embodiment, the display panel DP is described as a liquid crystal display panel. In some examples, a liquid crystal display device including a liquid crystal display panel may further include a polarizer and a backlight unit (e.g., a backlight).

The display panel DP includes a first substrate DS1, a second substrate DS2 spaced apart from the first substrate DS1, and a liquid crystal layer LCL disposed (e.g., located) between the first substrate DS1 and the second substrate DS2. On a plane, the display panel DP includes a display area DA where a plurality of pixels PX11 to PXnm and a non-display area NDA surrounding the display area DA.

The display panel DP includes a plurality of gate lines GL1 to GLn disposed (e.g., located) on the first substrate DS1 and a plurality of data lines DL1 to DLm crossing the plurality of gate lines GL1 to GLn. The plurality of gate lines GL1 to GLn is connected to the gate driving circuit 100. The plurality of data lines DL1 to DLm are connected to the data driving circuit 200. Only some of the plurality of gate lines GL1 to GLn and only some of the plurality of data lines DL1 to DLm are illustrated in FIG. 1. Additionally, the display panel DP may further include a dummy gate line GLd disposed (e.g., located) in the non-display area NDA of the first substrate DS1. The display panel DP may display a set or predetermined image (hereinafter referred to as a still image) during each of frame sections Fk−1, Fk, and Fk+1, or an image (hereinafter referred to as a video) that is changed during each of the frame sections Fk−1, Fk, and Fk+1.

Only some of the plurality of pixels PX11 to PXnm are illustrated in FIG. 1A. The plurality of pixels PX11 to PXnm are respectively connected to corresponding gate lines among the plurality of gate lines GL1 to GLn and corresponding data lines among the plurality of data lines DL1 to DLm. However, the dummy gate line GLd is not connected to the plurality of pixels PX11 to PXnm.

The plurality of pixels PX11 to PXnm may be divided into a plurality of groups according to a color displayed. The plurality of pixels PX11 to PXnm may display one of primary colors. The primary colors may include red, green, blue, and white. However, embodiments of the inventive concept are not limited thereto and thus the primary colors may further include various colors such as yellow, cyan, magenta, and/or the like.

The gate driving circuit 100 and the data driving circuit 200 receive a control signal from a signal control unit (e.g., a signal or timing controller) 310. The signal control unit 310 may be mounted on the main circuit board MCB. The signal control unit 310 receives image data and control signals from an external graphic control unit (e.g., an external graphic controller). The control signals may include vertical sync signals Vsync that are signals for distinguishing frame sections (e.g., frame periods) Fk−1, Fk, and Fk+1, horizontal sync signals Hsync that are signals for distinguishing horizontal sections (e.g., horizontal periods) HP, that is, row distinction signals, data enable signals (that are at a high level only during a section where data is outputted to display a data incoming area), and clock signals.

The gate driving circuit 100 generates gate signals GS1 to GSn on the basis of a control signal (hereinafter referred to as a gate control signal) received from the signal control unit 310 during frame sections Fk−1, Fk, and Fk+1 and outputs the gate signals GS1 to GSn to the plurality of gate lines GL1 to GLn. The gate signals GS1 to GSn may be sequentially outputted in correspondence to the horizontal sections HP. The gate driving circuit 100 and the pixels PX11 to PXnm may be formed concurrently (e.g., simultaneously) through a thin film process. For example, the gate driving circuit 100 may be mounted in an amorphous silicon TFT gate driver circuit (ASG) form or an oxide semiconductor TFT gate driver circuit (OSG) form in the non-display area NDA.

FIG. 1A illustrates one gate driving circuit 100 connected to the left ends of the plurality of gate lines GL1 to GLn. According to an embodiment of the inventive concept, a display device may include two gate driving circuits. One of the two gate driving circuits may be connected to the left ends of the plurality of gate lines GL1 to GLn and the other one may be connected to the right ends of the plurality of gate lines GL1 to GLn. Additionally, one of the two gate driving circuits may be connected to odd gate lines and the other one may be connected to even gate lines.

The data driving circuit 200 generates grayscale level voltages according to image data provided from the signal control unit 310 on the basis of a control signal (hereinafter referred to as a data control signal) received from the signal control unit 310. The data driving circuit 200 outputs the grayscale level voltages as data voltages DTS to the plurality of data lines DL1 to DLm.

The data voltages DTS may include positive data voltages having a positive value with respect to a common voltage and/or negative data voltages having a negative value with respect to the common voltage. Some of data voltages applied to the data lines DL1 to DLm have a positive polarity and others have a negative polarity during each of the horizontal sections HP. The polarity of the data voltages DTS may be inverted according to the frame sections Fk−1, Fk, and Fk+1 in order to reduce or prevent the deterioration of a liquid crystal. The data driving circuit 200 may generate data voltages inverted by each frame section in response to an invert signal.

The data driving circuit 200 may include a driving chip 210 and a flexible circuit board 220 mounting the driving chip 210. The data driving circuit 200 may include a plurality of driving chips 210 and the flexible circuit board 220. The flexible circuit board 220 connects the main circuit board MCB and the first substrate DS1 electrically. The plurality of driving chips 210 provide data signals corresponding to corresponding data lines among the plurality of data lines DL1 to DLm.

FIG. 1A illustrates a tape carrier package (TCP) type (kind) data driving circuit 200 as an example. According to an embodiment of the inventive concept, the data driving circuit 200 may be disposed in the non-display area NDA of the first substrate DS1 through a chip on glass (COG) implementation.

Referring to FIGS. 1A and 1B, the control voltage generation unit 300 includes a signal control unit 310 and an image determination unit (or an image determination circuit) 320. The control voltage generation unit 300 may be mounted on a main circuit board MCB. Because the signal control unit 310 is already described above, its description is may not be repeated hereinafter.

The image determination unit 320 determines whether there is a section for displaying a still image while the display panel DP displays a video. In more detail, the image determination unit 320 analyzes a data control signal outputted from the signal control unit 310 or data voltages DTS outputted from the data driving circuit 200, and if there is no change in data control signals or data voltages DTS during continuous frames, determines this section as a section where the display panel DP displays a still image. On the other hand, if there is a change in data control signals or data voltages DTS, the image determination unit 320 determine this section as a section for displaying a video.

Figure 3:
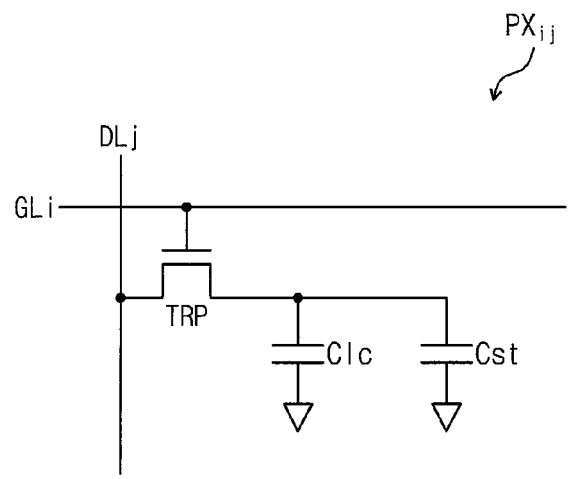
FIG. 3 is an equivalent circuit diagram of a pixel according to an embodiment of the inventive concept.
Figure 4:
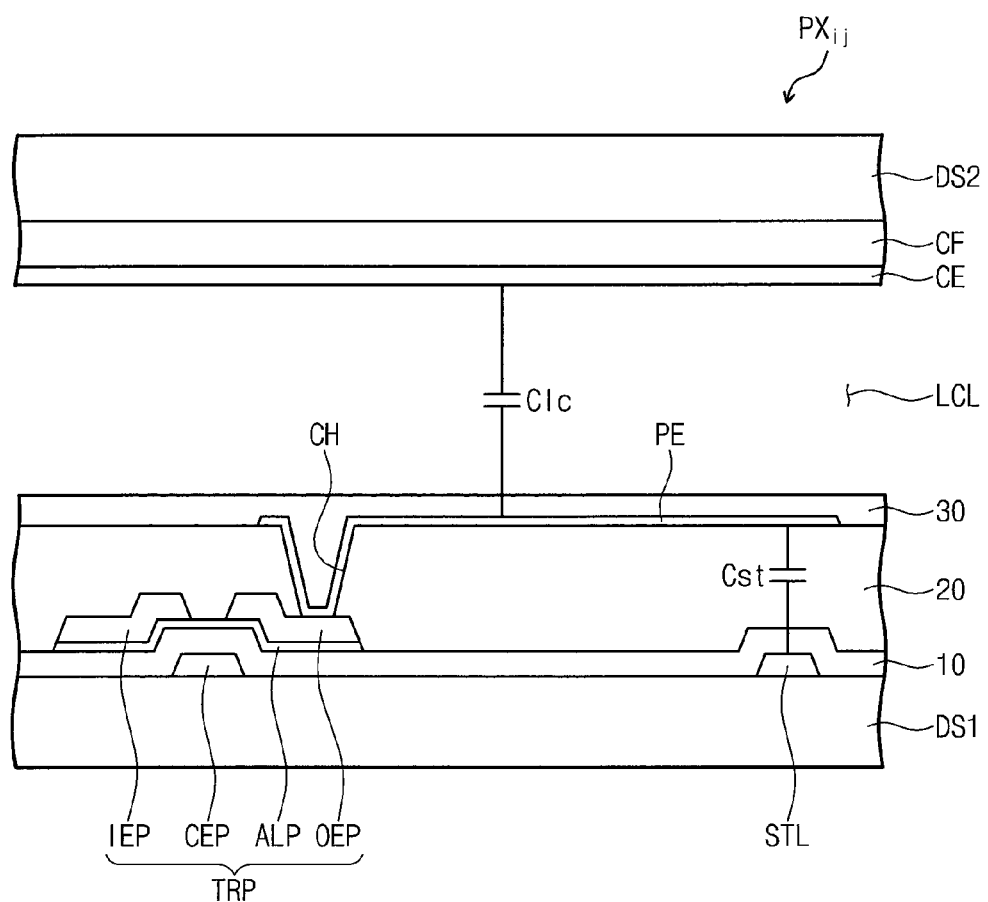
FIG. 4 is a sectional view of a pixel according to an embodiment of the inventive concept.

FIG. 3 is an equivalent circuit diagram of a pixel PXij according to an embodiment of the inventive concept. FIG. 4 is a sectional view of a pixel PXij according to an embodiment of the inventive concept. Each of the plurality of pixels PX11 to PXnm shown in FIG. 1A may have an equivalent circuit shown in FIG. 3.

As shown in FIG. 3, the PXij includes a pixel thin film transistor (hereinafter referred to as a pixel transistor) TRP, a liquid crystal capacitor Clc, and a storage capacitor Cst. According to an embodiment of the inventive concept, the storage capacitor Cst may be omitted.

The pixel transistor TRP is electrically connected to an ith gate line GLi and a jth data line DLj. The pixel transistor TRP outputs a pixel voltage corresponding to a data signal received from the jth data line DLj in response to a gate signal received from the ith gate line GLi.

The liquid crystal capacitor Clc charges a pixel voltage outputted from the pixel transistor TRP. An arrangement of liquid crystal directors included in the liquid crystal layer LCL (see, e.g., FIG. 3) is changed according to a charge amount charged in the liquid crystal capacitor Clc. The light incident onto a liquid crystal layer may be transmitted or blocked according to an arrangement of liquid crystal directors.

The storage capacitor Cst is connected in parallel to the liquid crystal capacitor Clc. The storage capacitor Cst maintains an arrangement of liquid crystal directors during a set or predetermined section.

As shown in FIG. 4, the pixel transistor TRP includes a control electrode CEP (hereinafter referred to as a pixel control electrode) connected to the ith gate line GLi (see, e.g., FIG. 2), an activation layer ALP (hereinafter referred to as a pixel activation layer) overlapping the pixel control electrode CEP, an input electrode IEP (hereinafter referred to as a pixel input electrode) connected to the jth data line DLj (see, e.g., FIG. 2), and an output electrode OEP spaced apart from the pixel input electrode IEP.

The liquid crystal capacitor Clc includes a pixel electrode PE and a common electrode CE. The storage capacitor Cst includes the pixel electrode PE and a portion of a storage line STL overlapping the pixel electrode PE.

The ith gate line GLi and the storage line STL are disposed on one surface of the first substrate DS1. The pixel control electrode CEP is branched from the ith gate line GLi. The ith gate line GLi and the storage line STL may include a metal (e.g., Al, Ag, Cu, Mo, Cr, Ta, Ti, and/or the like) or an alloy thereof. The ith gate line GLi and the storage line STL may have a multi-layer structure, and for example, may include a Ti layer and a Cu layer.

A first insulating layer 10 covering the pixel control electrode CEP and the storage line STL is disposed on one surface of the first substrate DS1. The first insulating layer 10 may include at least one of an inorganic material and an organic material. The first insulating layer 10 may be an organic layer or an inorganic layer. The first insulating layer 10 may have a multi-layer structure and for example, may include a silicon nitride layer and a silicon oxide layer.

The activation layer ALP overlapping the pixel control electrode CEP is disposed on the first insulating layer 10. The pixel activation layer ALP may include a semiconductor layer and an ohmic contact layer.

The pixel activation layer ALP may include amorphous silicon or poly silicon. Additionally, the pixel activation layer ALP may include a metal oxide semiconductor.

The pixel output electrode OEP and the pixel input electrode IEP are disposed on the pixel activation layer ALP. The pixel output electrode OEP and the pixel input electrode IEP are spaced from each other. Each of the pixel output electrode OEP and the pixel input electrode IEP may partially overlap the pixel control electrode CEP.

As the pixel transistor TRP having a staggered structure is shown in FIG. 4 as an example, a structure of the pixel transistor TRP is not limited thereto. The pixel transistor TRP may have a planar structure.

A second insulating layer 20 covering the pixel activation part ALP, the pixel output electrode OEP, and the pixel input electrode IEP is disposed on the first insulating layer 10. The second insulating layer 20 provides a flat surface. The second insulating layer 20 may include an organic material.

The pixel electrode PE is displayed on the second insulating layer 20. The pixel electrode PE is connected to the pixel output electrode OEP through the second insulating layer 20 and a contact hole (e.g., a contact opening) CH penetrating the second insulating layer 20. An alignment layer 30 covering the pixel electrode PE may be disposed on the second insulating layer 20.

A color filter layer CF is disposed on one surface of the second substrate DS2. A common electrode CE is disposed on the color filter layer CF. A common voltage is applied to the common electrode CE. A common voltage and a pixel voltage have different values. An alignment layer covering the common electrode CE may be disposed on the common electrode CE. Another insulating layer may be disposed between the color filter layer CF and the common electrode CE.

The pixel electrode PE and the common electrode CE with the liquid crystal layer LCL therebetween form the liquid crystal capacitor Clc. Additionally, portions of the pixel electrode PE and the storage line STL, which are disposed (e.g., located) with the first insulating layer 10 and the second insulating layer 20 therebetween, form the storage capacitor Cst. The storage line STL receives a storage voltage having a different value than a pixel voltage. A storage voltage may have the same or substantially the same value as a common voltage.

On the other hand, a section of the pixel PXij shown in FIG. 4 is just one example. Unlike FIG. 3, at least one of the color filter layer CF and the common electrode CE may be disposed on the first substrate DS1. That is, a liquid crystal display panel according to this embodiment of the inventive concept may include a pixel operating in a vertical alignment (VA) mode, a patterned vertical alignment (PVA) mode, an in-plane switching (IPS) mode, a fringe-field switching (FFS) mode, or a plane to line switching (PLS) mode.

Figure 5:
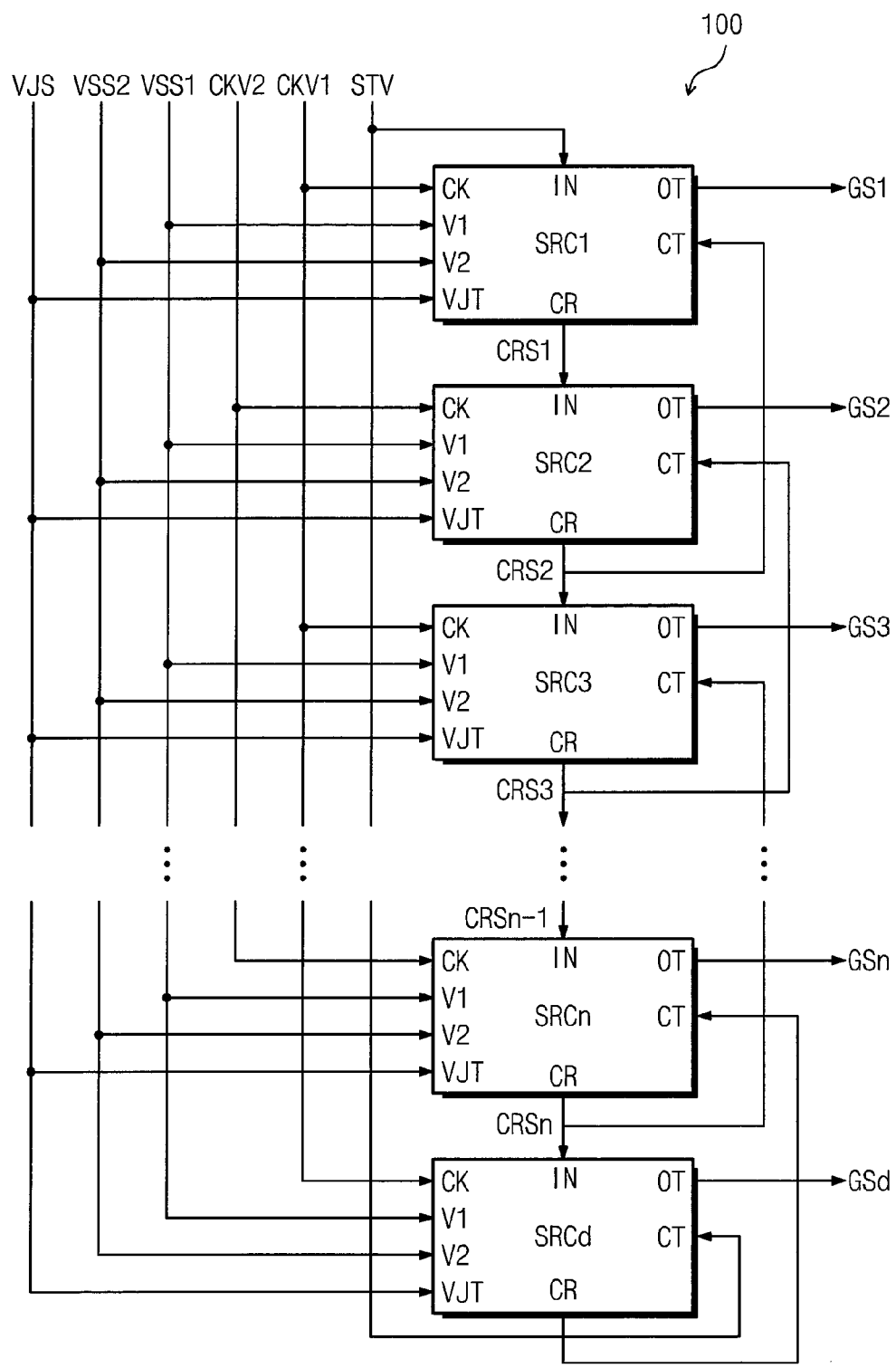
FIG. 5 is a block diagram illustrating a gate driving circuit according to an embodiment of the inventive concept.

FIG. 5 is a block diagram illustrating a gate driving circuit 100 according to an embodiment of the inventive concept. As shown in FIG. 5, a gate driving circuit 100 includes a plurality of stages SRC1 to SRCn. The plurality of stages SRC1 to SRCn configures one shift register. As shown in FIG. 5, the plurality of stages SRC1 to SRCn may be connected in cascade to each other.

The plurality of stages SRC1 to SRCn are respectively connected to the plurality of gate lines GL1 to GLn. That is, the plurality of stages SRC1 to SRCn provide gate signals GS1 to GSn to the plurality of gate lines GL1 to GLn.

Each of the plurality of stages SRC1 to SRCn includes an input terminal IN, a clock terminal CK, a first voltage input terminal V1, a second voltage input terminals V2, a control terminal CT, an image determination terminal VJT, a gate output terminal OT, and a carry output terminal CR.

The carry output terminal CR of each of the plurality of stages SRC1 to SRCn is electrically connected to the input terminal IN of the next driving state. The input terminal IN of the first stage SRC1 receives a start signal STV for starting the drive of the gate driving circuit 100, instead of the carry signal of a previous stage. After the first stage, the input terminal IN of each of the plurality of stages SRC2 to SRCn receives a carry signal of a previous stage. The input terminal IN of the ith stage is electrically connected to the carry output terminal CR of the (i−1)th stage. Herein, i is an integer greater than 1 and less than n. As shown in FIG. 5, the input terminals IN of the second stage SRC2 and the third stage SRC3 respectively receive the carry signals of the first stage SRC1 and the second stage SRC2. The carry signal of the (i−1)th stage applied to the input terminal IN of the ith stage serves to drive the ith stage.

Moreover, this is just one example, and the input terminal IN of the ith stage may be electrically connected to the carry terminal of any previous stage, for example, the carry terminal of the (i−1)th stage, the (i−2)th stage, or the (i−3)th stage. As one example, the second stage SRC2 may receive a start signal different from the start signal received by the first stage SRC1, and the input terminal IN of the third stage SRC3 may receive the carry signal of the first stage SRC1.

The clock terminal CK receives a first clock signal CKV1 and a second clock terminal CKV2 (or a clock bar signal). Each of the first clock signal CKV1 and the second clock signal CKV2 swings between a first clock voltage VCK1 (see, e.g., FIG. 7) and a second clock voltage VCK2 (see, e.g., FIG. 7). A phase difference between the first clock signal CKV1 and the second clock signal CKV2 is 180°. The first clock voltage VCK1 may be about 15 V or more and about 35 V or less. The second clock voltage VCK2 may be about −15 V or more and about −10 V or less.

The control terminal CT of each of the plurality of stages SRC1 to SRCn is electrically connected to the carry terminal CR of the next stage to receive a carry signal of the next stage. As shown in FIG. 5, the control terminal CT of the first stage SRC1 is electrically connected to the carry output terminal CR of the second stage SRC2.

However, the control terminal CT of the last driving stage SRCn among the plurality of stages SRC1 to SRCn receives a signal corresponding to a carry signal from the dummy stage SRCd. The dummy stage SRCd may be sequentially connected to the rear end of the last driving stage SRCn. However, the positions and number of the dummy stages SRCd may be changed according to the design intent of one skilled in the art.

FIG. 5 is just an example of a gate driving circuit and a connection relationship of the plurality of stages SRC1 to SRCn shown in FIG. 5 may be changed.

Unlike FIG. 5, the input terminals IN of the plurality of stages SRC1 to SRCn may respectively receive gate signals from the output terminals OT of previous stages. That is, carry signals or gate signals applied to the input terminals IN of the plurality of stages SRC1 to SRCn are one control signal for controlling an operation of the plurality of stages SRC1 to SRCn.

Additionally, unlike FIG. 5, the control terminal CT of each of the plurality of stages SRC1 to SRCn may be electrically connected to the output terminal OT of the next stage instead of the carry output terminal CR of the next stage to receive a gate signal from the next stage.

A first low voltage VSS1 is applied to the first voltage input terminal V1 of each of the plurality of stages SRC1 to SRCn, and a second low voltage VSS2 lower than the first low voltage VSS1 is applied to the second voltage input terminal V2 of each of the plurality of stages SRC1 to SRCn. The first low voltage VSS1 may be about −10 V or more and about −5 V or less and the second low voltage VSS2 may be about −15 V or more and about −10 V or less. As one example, the first low voltage VSS1 may be about −7.5 V and the second low voltage VSS2 may be about −11.5 V.

The second low voltage VSS2 may be substantially identical to the second clock voltage VCK2.

The gate output terminal OT of each of the plurality of stages SRC1 to SRCn is connected to a corresponding gate line. Accordingly, a gate signal outputted through the gate output terminal OT is applied to a corresponding gate line.

The image determination terminal VJT receives an image determination signal VJS including a first image determination voltage VJ-M and a second image determination voltage VJ-S from the image determination unit 320. The second image determination voltage VJ-S is greater than the first image determination voltage VJ-M. For example, the first image determination voltage VJ-M may be about −12 V or more and about −6 V or less, and the second image determination voltage VJ-M may be about 15 V or more and about 35 V or less.

The image determination signal VJS is changed depending on whether an image displayed by the display panel DP is a video or a still image, and this will be described in more detail with reference to FIG. 8.

Figure 6:
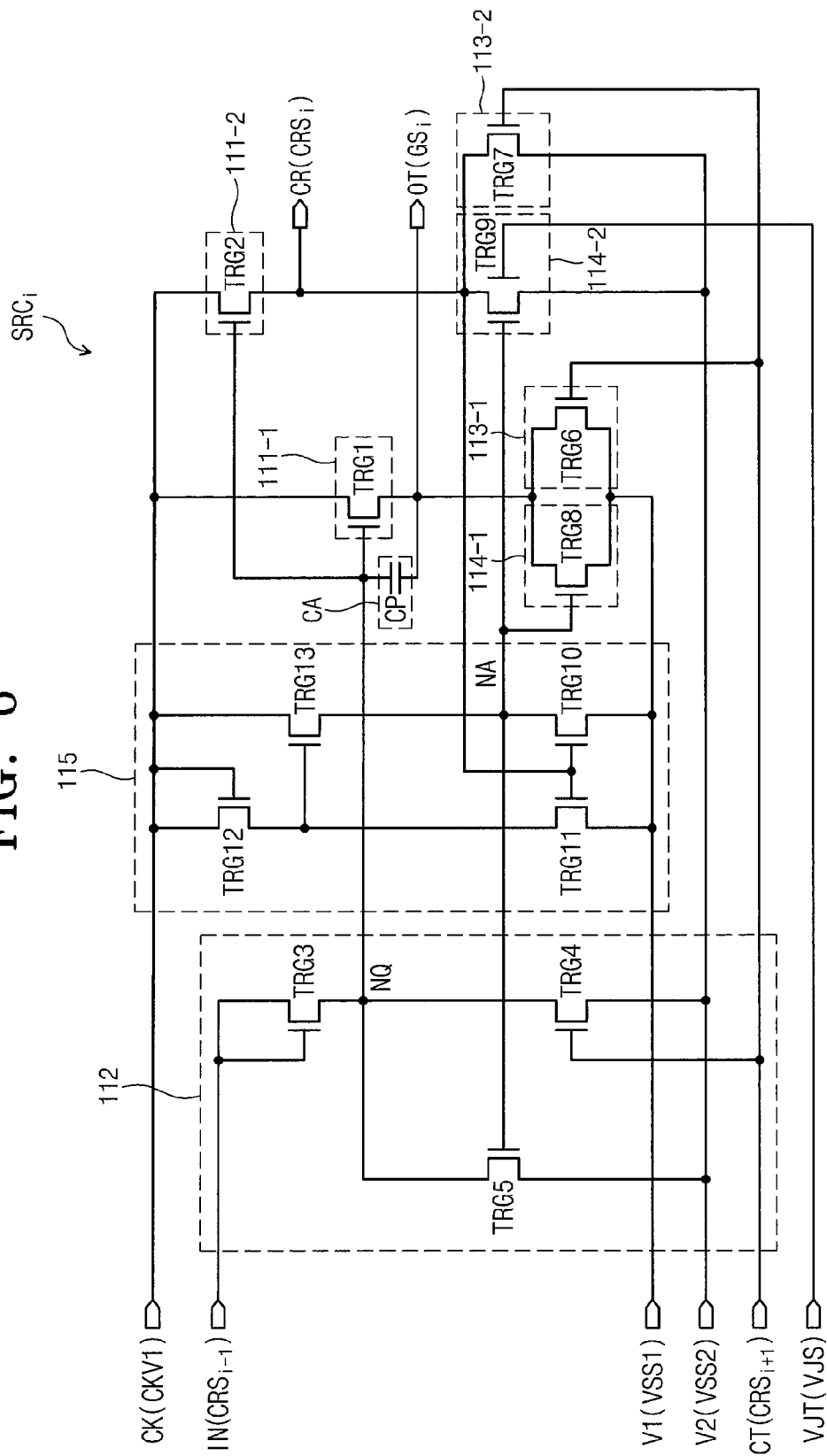
FIG. 6 is a circuit diagram illustrating an ith stage among a plurality of stages shown in FIG. 5.
Figure 7:
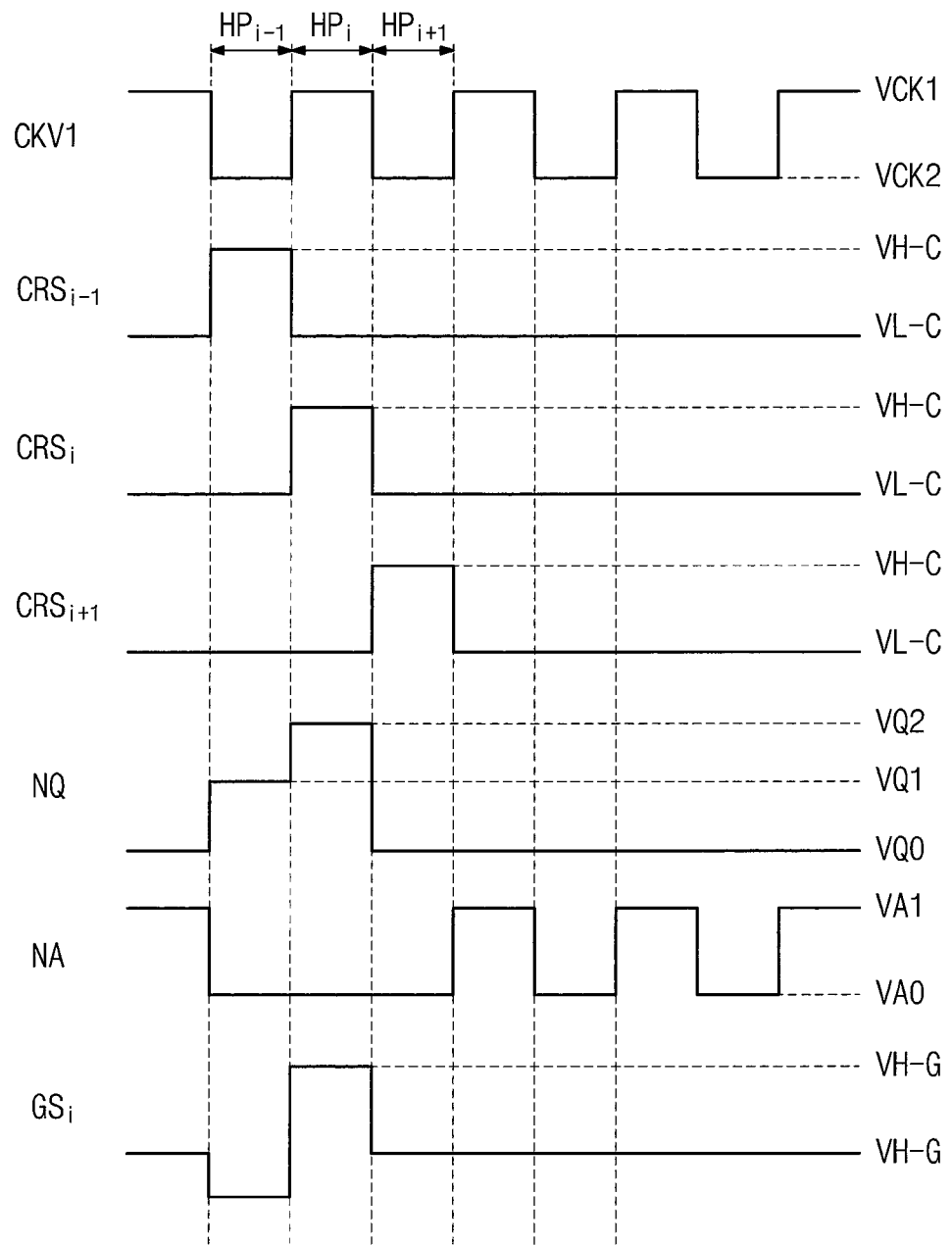
FIG. 7 is an input/output signal waveform diagram illustrating an ith stage shown in FIG. 6.

FIG. 6 is a circuit diagram illustrating the ith stage SRCi among the plurality of stages SRC1 to SRCn shown in FIG. 5; and FIG. 7 is an input/output signal waveform diagram of the ith stage SRCi shown in FIG. 6. Each of the plurality of stages SRC1 to SRCn shown in FIG. 5 may have the same or substantially the same circuit configuration as that of FIG. 6.

The ith stage SRCi includes a first output unit (e.g., a first output circuit) 111-1, a second output unit (e.g., a second output circuit) 111-2, a charging unit (e.g., a charger) CA, a control unit (e.g., a controller) 112, a first pull-down unit (e.g., a first pull-down circuit) 113-1, a second pull-down unit (e.g., a second pull-down circuit) 113-2, a first holding unit (e.g., a first holding circuit) 114-1, a second holding unit (e.g., a second holding circuit) 114-2, and an inverter unit (e.g., an inverter) 115.

The first output unit 111-1 outputs a gate signal GSi to the ith gate line, and the second output unit 111-2 outputs a carry signal CRSi to the (i+1)th stage.

Each of the gate signals GS1 and GSn includes a section for maintaining a gate-high voltage VH-G and a section for maintaining a gate-low voltage VL-G. The gate-high voltage VH-G is substantially identical to the first clock voltage VCK1. The gate-low voltage VL-G is substantially identical to the first low voltage VSS1.

Each of the carry signals CRS1 to CRSn includes a section for maintaining a carry-high voltage VH-C and a section for maintaining a carry-low voltage VL-C. The carry-high voltage VH-C is substantially identical to the first clock voltage VCK1. The carry-low voltage VL-C is substantially identical to the second low voltage VSS2.

The charging unit CA is charged by a high voltage of the carry signal CRSi−1 of the (i−1)th stage applied to the Q-node NQ.

The control unit 112 controls on/off of the first output unit 111-1 and the second output unit 111-2 by adjusting a voltage of the Q-node NQ. The control unit 112 turns on the first output unit 111-1 and the second output unit 111-2 in response to the carry signal CRSi−1 of the (i−1)th stage and turns off the first output unit 111-1 and the second output unit 111-2 in response to the carry signal CRSi+1 of the (i+1)th stage. Then, the control unit 112 provides the second low voltage VSS2 to the Q-node NQ according to a voltage of an A-node NA.

The first pull-down unit 113-1 provides the first low voltage VSS1 to the gate output terminal OT to pull down a voltage of the gate signal GSi from the gate-high voltage VH-G to the gate low voltage VL-G. The second pull-down unit 113-2 provides the second low voltage VSS2 to the carry output terminal CR to pull down a voltage of the carry signal CRSi from the carry-high voltage VH-C to the carry-low voltage VL-C.

After the first pull-down unit 113-1 pulls down a voltage of the gate signal GSi, the first holding unit 114-1 provides the first low voltage VSS1 to the gate output terminal OT to maintain a voltage of the gate signal GSi at the gate-low voltage VL-G. After the second pull-down unit 113-2 pulls down a voltage of the carry signal CRSi, the second holding unit 114-2 provides the second low voltage VSS2 to the carry output terminal CR to maintain a voltage of the carry signal CRSi at the carry-low voltage VL-C.

The inverter unit 114 controls operations of the first holding unit 114-1 and the second holding unit 114-2. The inverter unit 114 provides an inverter signal for turning on/off the first holding unit 114-1 and the second holding unit 114-2 to the A-node NA. Herein, the A-node NA is a node where an inverter signal generated based on the clock signal CKV is applied from the inverter unit 114 and which is connected to the control electrode of a transistor included in each of the first holding unit 114-1 and the second holding unit 114-2. Additionally, the A-node NA is involved in applying the second low voltage VSS2 to the Q-node NQ. The inverter signal is an alternating current (AC) signal that swings (e.g., oscillates) between an inverter-low voltage VA0 and an inverter-high voltage VA1.

Referring to FIGS. 6 and 7, a configuration of the ith stage SRCi will be examined in more detail. FIG. 7 is a view illustrating a horizontal section (e.g., a horizontal period) HPi (hereinafter referred to as an ith horizontal section) where an ith gate signal GSi is outputted, an immediately previous horizontal section (e.g., an immediately previous horizontal period) HPi−1 (hereinafter referred to as an (i−1)th horizontal section), and an immediately subsequent horizontal section (e.g., an immediately subsequent horizontal period) HPi+1 (hereinafter referred to as an (i+1)th horizontal section), among a plurality of horizontal sections.

The first output unit 111-1 includes a first output transistor TRG1. The first output transistor TRG1 includes an input electrode where the first clock signal CKV1 is applied, a control electrode connected to the Q-node NQ, and an output electrode connected to the gate output terminal OT. The first clock signal CKV1 is applied to the input electrode of the first output transistor TRG1 through the clock terminal CK. The gate signal GSi is outputted through the gate output terminal OT. The Q-node NQ is an output terminal of the control unit 112. Although it is shown exemplarily in FIG. 6 that the first clock signal CKV1 is applied through the clock terminal CK, embodiments of the inventive concept are not limited thereto and the second clock signal CKV2 may be applied through the clock terminal CK.

The second output unit 111-2 includes a second output transistor TRG2. The second output transistor TRG2 includes an input electrode for receiving the first clock signal CKV1, a control electrode connected to the Q-node NQ, and an output electrode connected to the carry terminal CR. A carry signal CRSi is outputted through the carry output terminal CR.

The charging unit CA includes a capacitor CP. The capacitor CP is disposed between the control electrode and the output electrode of the first output transistor TRG1. One end of the capacitor CP is connected to the Q-node NQ, and the other end of the capacitor CP is connected to the gate output terminal OT.

The control unit 112 includes first to third control transistors TRG3, TRG4, and TRG5.

The first control transistor TRG3 includes a control electrode where the carry signal CRSi−1 outputted from the (i−1)th stage SRCi−1 is applied, an input electrode connected to the control electrode of the first control transistor TRG3, and an output electrode connected to the Q-node NQ. The carry signal CRSi−1 of the (i−1)th stage is a control signal applied to the control electrode of the first control transistor TRG3.

The second control transistor TRG4 includes a control electrode connected to the control terminal CT to receive the carry signal CRSi+1 of the (i+1)th stage, an input electrode connected to the second voltage input terminal V2 to receive the second low voltage VSS2, and an output electrode connected to the Q-node NQ.

The third control transistor TRG5 includes a control electrode connected to the A-node NA, an input electrode connected to the second voltage input terminal V2 to receive the second low voltage VSS2, and an output electrode connected to the Q-node NQ.

The control unit 112 may further include a transistor connected in series to the first control transistor TRG3 or the second control transistor TRG4 in order to prevent or substantially prevent current from leaking from the Q-node NQ toward the control unit 112.

When the first control transistor TRG3 is turned on in response to the carry signal CRSi−1 of the (i−1)th stage, the potential of the Q-node NQ is raised from a base voltage VQ0 to a first boosting voltage VQ1, and the first output transistor TRG1 and the second output transistor TRG2 are turned on. At this point, as the first output transistor TRG1 is turned on, the second clock voltage VCK2 of the first clock signal CKV1 may be applied from the clock terminal CK to the gate output terminal OT. The base voltage VQ0 may be substantially identical to the second low voltage VSS2.

When the carry signal CRSi−1 of the (i−1)th stage is applied to the Q-node NQ, the capacitor CP is charged. Then, the first output transistor TRG1 is bootstrapped. That is, the Q-node NQ connected to the control electrode of the first output transistor TRG1 is boosted from the first boosting voltage VQ1 to the second boosting voltage VQ2. The second boosting voltage VQ2 is greater than the first boosting voltage VQ1.

When the second control transistor TRG4 is turned on in response to the carry signal CRSi+1 of the (i+1)th stage, a voltage of the Q-node NQ is lowered to the base voltage VQ0. When the third control transistor TRG5 is turned on in response to the inverter signal applied to the A-node NA, a voltage of the Q-node NQ is maintained at the base voltage VQ0. When a voltage of the Q-node NQ is lowered to the base voltage VQ0, the first and second output transistors TRG1 and TRG2 connected to the Q-node NQ are turned off.

The first pull-down unit 113-1 includes a first pull-down transistor TRG6. The first pull-down transistor TRG6 provides the first low voltage VSS1 to the gate output terminal OT in response to the carry signal CRSi+1 of the (i+1)th stage. The first pull-down transistor TRG6 includes a control electrode connected to the control terminal CT to receive the carry signal CRSi+1 of the (i+1)th stage, an input electrode connected to the first voltage input terminal V1 to receive the first low voltage VSS1, and an output electrode connected to the gate output terminal OT. The output electrode of the first pull-down transistor TRG6 is connected to the output electrode of the first output transistor TRG1. However, a connection structure of the first pull-down transistor TRG6 is not limited to the above, and the input electrode of the first pull-down transistor TRG6 may be connected to the second voltage input terminal V2 to receive the second low voltage VSS2.

That is, when the Q-node NQ is boosted to the second boosting voltage VQ2 in the ith horizontal section HPi, a voltage of the gate signal GSi becomes the gate-high voltage VH-G. Then, as the first pull-down transistor TRG6 of the first pull-down unit 113-1 is turned on, it pulls down a voltage of the gate signal GSi to the gate-low voltage VL-G.

The second pull-down unit 113-2 includes a second pull-down transistor TRG7. The second pull-down transistor TRG7 provides the second low voltage VSS2 to the carry output terminal CR in response to the carry signal CRSi+1 of the (i+1)th stage. The second pull-down transistor TRG7 includes a control electrode connected to the control terminal CT to receive the carry signal CRSi+1 of the (i+1)th stage, an input electrode connected to the second voltage input terminal V2 to receive the second low voltage VSS2, and an output electrode connected to the carry output terminal CR. The output electrode of the second pull-down transistor TRG7 is connected to the output electrode of the second output transistor TRG2. However, a connection structure of the second pull-down transistor TRG7 is not limited to the above, and the input electrode of the second pull-down transistor TRG7 may be connected to the first voltage input terminal V1 to receive the first low voltage VSS1.

That is, when the Q-node NQ is boosted to the second boosting voltage VQ2 in the ith horizontal section HPi, a voltage of the carry signal CRSi becomes the carry-high voltage VH-C. Then, as the second pull-down transistor TRG7 of the second pull-down unit 113-2 is turned on, it pulls down a voltage of the carry signal CRSi to the carry-low voltage VL-C.

The first holding unit 114-1 includes a first holding transistor TRG8. The first holding transistor TRG8 includes an input electrode connected to the first voltage input terminal V1, a control electrode connected to the A-node NA, and an output electrode connected to the gate output terminal OT. According to an embodiment of the inventive concept, the input electrode of the first holding transistor TRG8 may be connected to the second voltage input terminal V2.

After the (i−1)th horizontal section HPi+1, the first holding transistor TRG8 provides the first low voltage VSS1 to the gate output terminal OT in response to an inverter signal outputted from the A-node NA.

The second holding unit 114-2 includes a second holding transistor TRG9. The first holding transistor TRG8 includes an input electrode connected to the second voltage input terminal V2, a first control electrode connected to the A-node NA, a second control electrode connected to the image determination terminal VJT, and an output electrode connected to the carry output terminal CR. According to an embodiment of the inventive concept, the input electrode of the second holding transistor TRG9 may be connected to the second voltage input terminal V2. The second holding transistor TRG9 is turned on by an inverter signal having the inverter-high voltage VA1 applied to the first control electrode of the second holding transistor TRG9, or an image determination signal VJS having the second image determination voltage VJ-S applied to the second control electrode of the second holding transistor TRG9.

After the (i+1)th horizontal section HPi+1, the second holding transistor TRG9 provides the second low voltage VSS2 to the carry output terminal CR in response to an inverter signal outputted from the A-node NA.

The inverter unit 115 provides the first low voltage VSS1 to the A-node NA in response to the carry signal CRSi outputted from the second output unit 111-2. Then, the inverter unit 114 provides the first clock signal CKV1 to the A-node NA. The inverter unit 115 outputs an inverter signal having the inverter-low voltage VA0 in the (i−1)th horizontal period HPi−1, the ith horizontal period HPi, and the (i+1)th horizontal period HPi+1. Then, the inverter unit 115 outputs an inverter signal having the inverter high voltage VA1. The inverter unit 114 outputs an inverter signal having the substantially same level as the first clock signal CKV1 until a corresponding frame ends from the (i+2)th horizontal section.

The inverter unit 115 includes first to fourth inverter transistors TRG10, TRG11, TRG12, and TRG13.

The first inverter transistor TRG10 includes an output electrode connected to the A-node NA, a control electrode connected to the carry output terminal CR, and an input electrode connected to the first voltage input terminal V1 to receive the first low voltage VSS1.

The second inverter transistor TRG11 includes an output electrode connected to the output electrode of the third inverter transistor TRG12 and the control electrode of the fourth inverter transistor TRG13, a control electrode connected to the carry output terminal CR, and an input electrode connected to the first voltage input terminal V1 to receive the first low voltage VSS1.

The control electrode and input electrode of the third inverter transistor TRG12 is connected to the clock terminal CK. The output electrode of the third inverter transistor TRG12 is connected to the output electrode of the second inverter transistor TRG11 and the control electrode of the fourth inverter transistor TRG13.

The fourth inverter transistor TRG13 includes an input electrode connected to the clock terminal CK, a control electrode connected to the output electrode of the third inverter transistor TRG12, and an output electrode connected to the A-node NA.

The first inverter transistor TRG10 and the second inverter transistor TRG11 supply the first low voltage VSS1 to the A-node NA in response to the carry signal CRSi during the ith horizontal section HPi. Accordingly, the first holding transistor TRG8 and the second holding transistor TRG9 are turned off during the ith horizontal section HPi.

Figure 8:
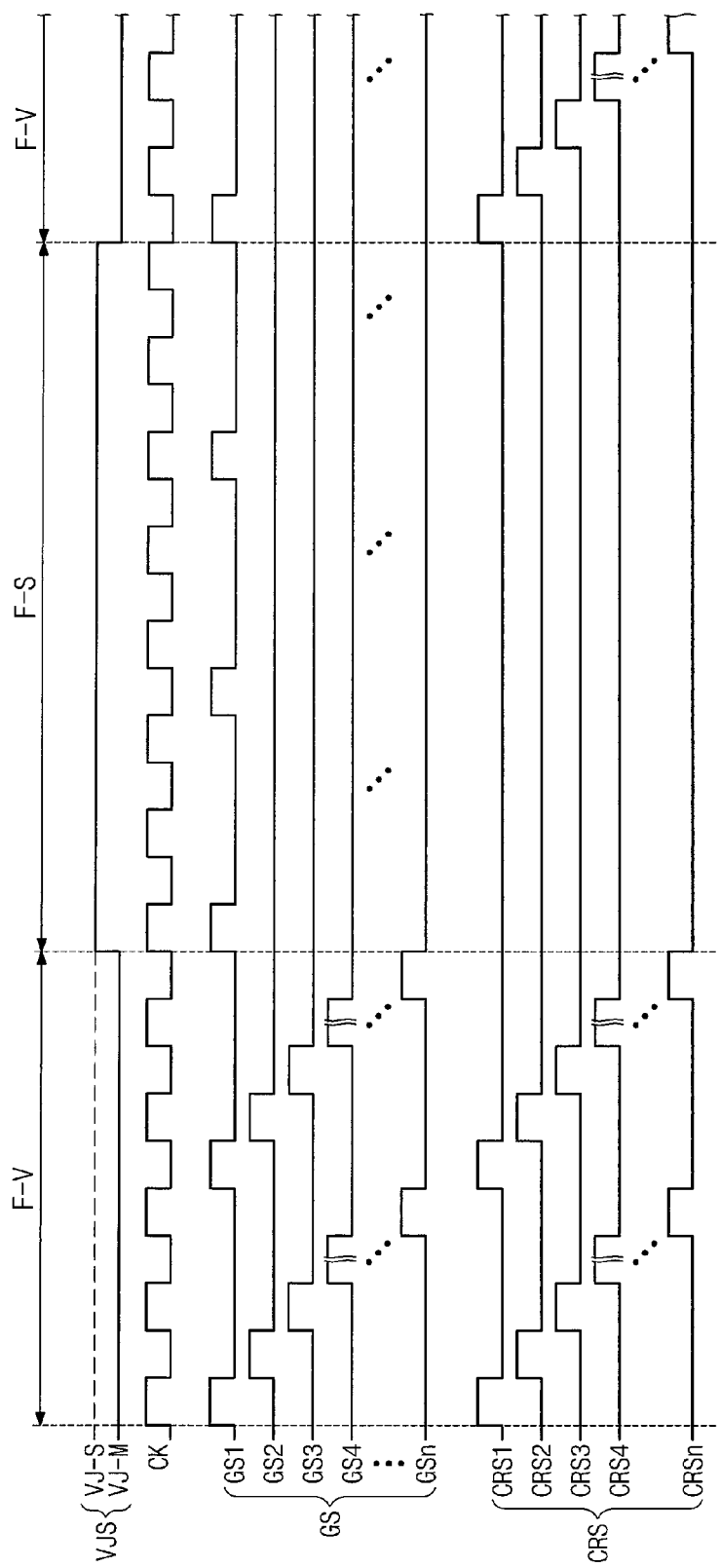
FIG. 8 is a timing diagram illustrating signals of a display device according to an embodiment of the inventive concept.

FIG. 8 is a timing diagram illustrating signals of a display device according to an embodiment of the inventive concept.

The display device DD displays a video or a still image to consumers through the display panel DP. The video may be conceptualized as an image in which information displayed on the display panel DP is changed in each of a plurality of frames. The still image may be conceptualized as an image in which information displayed on the display panel DP is constant in each of a plurality of frames.

A section (e.g., period) where the display device DD displays an image may be divided into a still image display section (e.g., a still image display period) F-S (or a first section) and a video display section (e.g., a video display period) F-V (or a second section). Each of the video display section F-V and the still image display section F-S may include a plurality of continuous frames. The video display section F-V and the still image display section F-S may be divided (e.g., defined) by the image determination unit 320.

In the video display section F-V, the image determination signal VJS has a first image determination voltage VJ-M (or a video determination voltage). The first image determination voltage VJ-M may be substantially identical to the first low voltage VSS1 or the second low voltage VSS2.

In the still image display section F-S, the image determination signal VJS has a second image determination voltage VJ-S (or a still image determination voltage). The second image determination voltage VJ-S may be greater than the first image determination voltage VJ-M and may be substantially identical to the first clock voltage VCK1.

Referring to FIGS. 6 and 8, when the second holding transistor TRG9 is turned on in the still image display section F-S, the second holding unit 114-2 may provide the second low voltage VSS2 to the carry output terminal CR. That is, in the still image display section F-S, the carry signal CRSi outputted from the carry output terminal CR has the carry-low voltage VL-C by the second low voltage VSS2.

Referring to FIGS. 5 and 8, at least one of the carry signals CRS1 to CRSn has only the carry-low voltage VL-C in the still image display section F-S. For example, in the still image display section F-S, when the carry signal CRS1 of the first stage SRC1 has the carry-low voltage VL-C, the first control transistor TRG3 of the control unit 112 of the second stage SRC2 connected to the input terminal IN of the second stage SRC2 is not turned on. Then, the second stage SRC2 and the stages SRC3 to SRCn connected in cascade thereto do not operate (e.g., are deactivated or powered down).

When the carry signal CRS1 of the first stage SRC1 has the carry-low voltage VL-C, each of the gate signals GS2 to GSn of the second to nth stages SRC2 to SCRn has the gate-low voltage VL-G and each of the carry signals CRS2 to CRSn of the second to nth stages SRC2 to SCRn has the carry-low voltage VL-C. However, because the first gate signal GS1 is not affected by the image determination signal VJS, it may have the gate-high voltage VH-G in the still image display section F-S.

According to an embodiment of the inventive concept, without an additional control on the clock signals CKV1 and CKV2, all or some operations of the stages SRC1 to SRCn of the gate driving circuit 100 may stop (e.g., be deactivated), so that power consumed by the display device DD may be reduced during the still image display section F-S.

Figure 9:
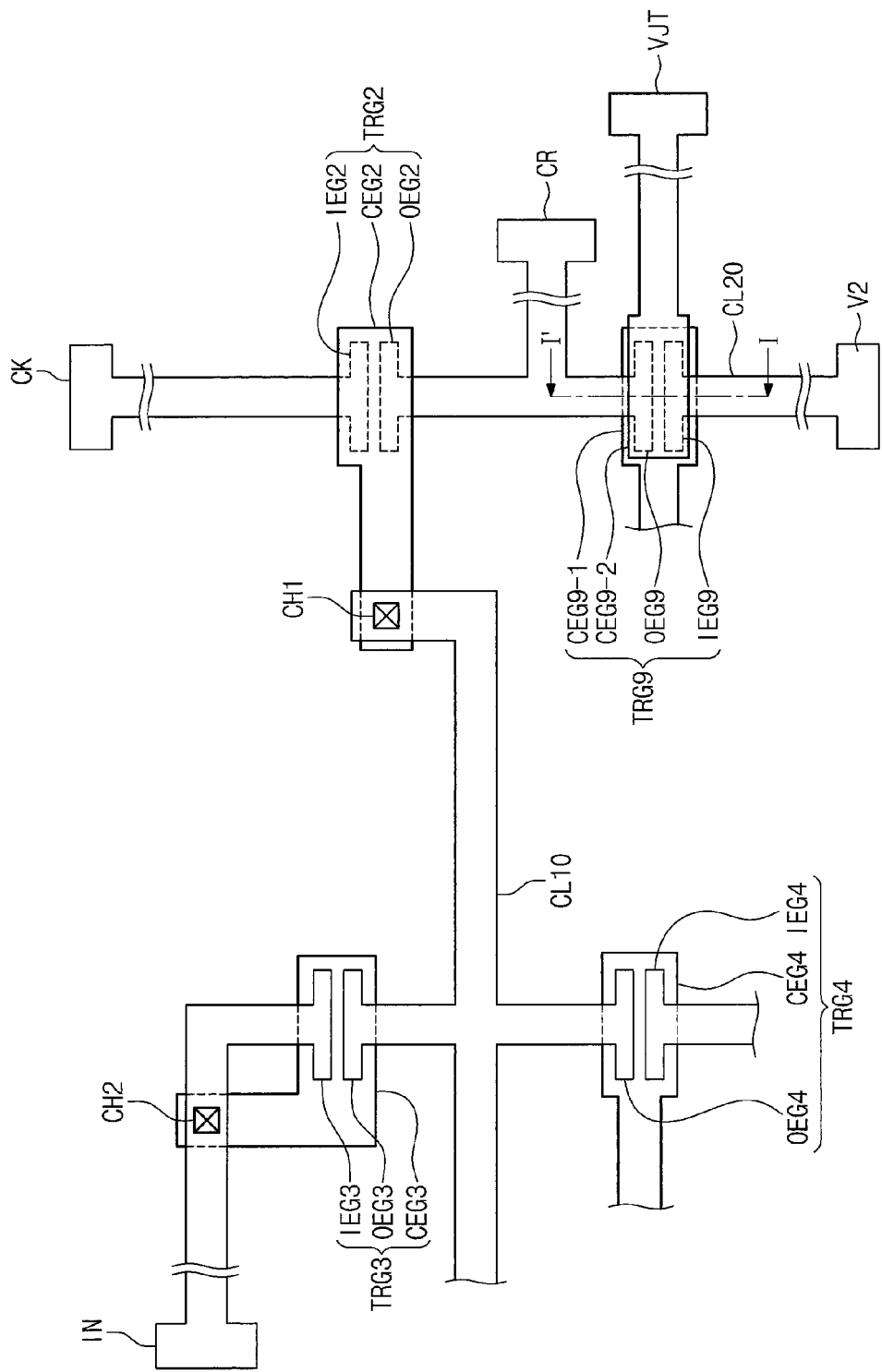
FIG. 9 is a plan view illustrating a layout of a part of an ith stage shown in FIG. 6.
Figure 10:
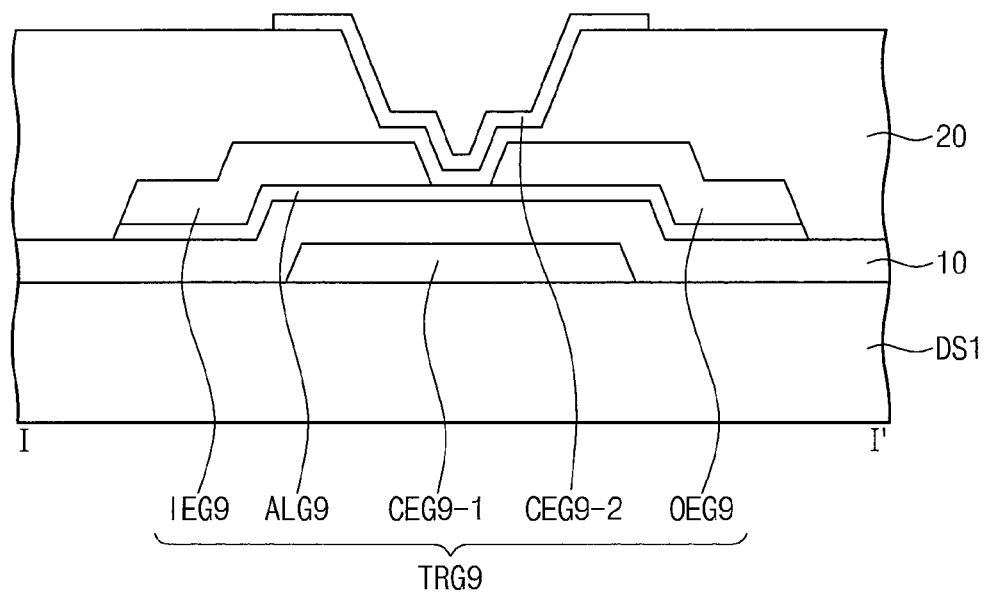
FIG. 10 is a sectional view taken along the line I-I' of FIG. 8.

FIG. 9 is a plan view illustrating a layout of a part of the ith stage SRCi shown in FIG. 6. FIG. 10 is a sectional view taken along the line I-I' of FIG. 9.

FIG. 9 illustrates the first output transistor TRG2, first control transistor TRG3, second control transistor TRG4, and second holding transistor TRG9 of the ith driving stage SRCi (see, e.g., FIG. 6) and a connection structure thereof.

In more detail, the ith driving stage SRCi includes a first conductive layer, a second conductive layer, a third conductive layer, and an activation layer, which are disposed on different layers. The first conductive layer, the second conductive layer, and the third conductive layer may include a plurality of electrodes and wires. The activation layer includes a plurality of patterned parts. An insulating layer is disposed between each of the first conductive layer, the second conductive layer, and the third conductive layer (e.g., between the first conductive layer and the second conductive layer, between the second conductive layer and the third conductive layer, and between the first conductive layer and the third conductive layer).

As shown in FIGS. 9 and 10, a part of the first conductive layer configures the control electrode CEG2 of the second output transistor TRG2, the control electrode CEG3 of the first control transistor TRG3, the control electrode CEG4 of the second control transistor TRG4, and the first control electrode CEG9-1 of the first holding transistor TRG9.

A part of the second conductive layer configures the input electrodes IEG2, IEG3, IEG4, and IEG9 and output electrodes OEG2, OEG3, OEG4, and OEG9 of the transistors TRG2, TRG3, TRG4, and TRG9.

A part of the third conductive layer configures the second control electrode CEG9-2 of the first holding transistor TRG9.

The second conductive layer may include a first wire CL10 for connecting the transistors TRG2, TRG3, and TRG4. The first wire CL10 corresponds to the Q-node NQ shown in FIG. 6. Additionally, the third conductive layer may include a second wire CL20 for connecting the second control electrode CEG9-2 of the first holding transistor TRG9 to the second voltage input terminal V2.

The control electrode CEG2 of the second output transistor TRG2 and the first wire CL10 may be connected through a first contact hole (e.g., a first contact opening) CH1 that penetrates an insulating layer between the first conductive layer and the second conductive layer.

The control electrode CEG3 of the first control transistor TRG3 may be connected to the input electrode IEG3 of the first control transistor TRG3 and the input terminal IN through a second contact hole (e.g., a second contact opening) CH2 that penetrates an insulating layer between the first conductive layer and the second conductive layer.

Referring to FIGS. 4 and 9, the first control electrode CEG9-1 of the first holding transistor TRG9 is disposed on the same layer as the pixel control electrode GEP of the pixel transistor TRP. The first control electrode CEG9-1 of the first holding transistor TRG9 may be formed of the same material and have the same layer structure as the pixel control electrode CEP of the pixel transistor TRP.

The input electrode IEG9 and output electrode OEG9 of the first holding transistor TRG9 are disposed on the same layer as the pixel input electrode IEP and pixel output electrode OEP of the pixel transistor TRP. The input electrode IEG9 and output electrode OEG9 of the first holding transistor TRG9 may be formed of the same material and have the same layer structure as the pixel input electrode IEP and pixel output electrode OEP of the pixel transistor TRP.

The first insulating layer 10 is disposed (e.g., located) commonly with the same layer structure in the first holding transistor TRG9 and the pixel transistor TRP.

The activation layer ALG9 of the first holding transistor TRG9 may be disposed on the same layer as the pixel activation layer ALP of the pixel transistor TRP. The activation layer ALG9 of the first output transistor TRG9 may be formed of the same material and have the same layer structure as the pixel activation layer ALP of the pixel transistor TRP.

The first holding transistor TRG9 further includes a second control electrode CEG9-2 in comparison to the pixel transistor TRP. The second control electrode CEG9-2 overlaps the first control electrode CEG9-1. The second control electrode CEG9-2 may be formed of the same materials as the first control electrode CEG9-1. The image determination signal VJS is applied to the second control electrode CEG9-2 of the first holding transistor TRG9.

Current flows in the activation layer ALG9 in response to a signal applied to the first control electrode CEG9-1 or second control electrode CEG9-2 of the first holding transistor TRG9.

Figure 11:
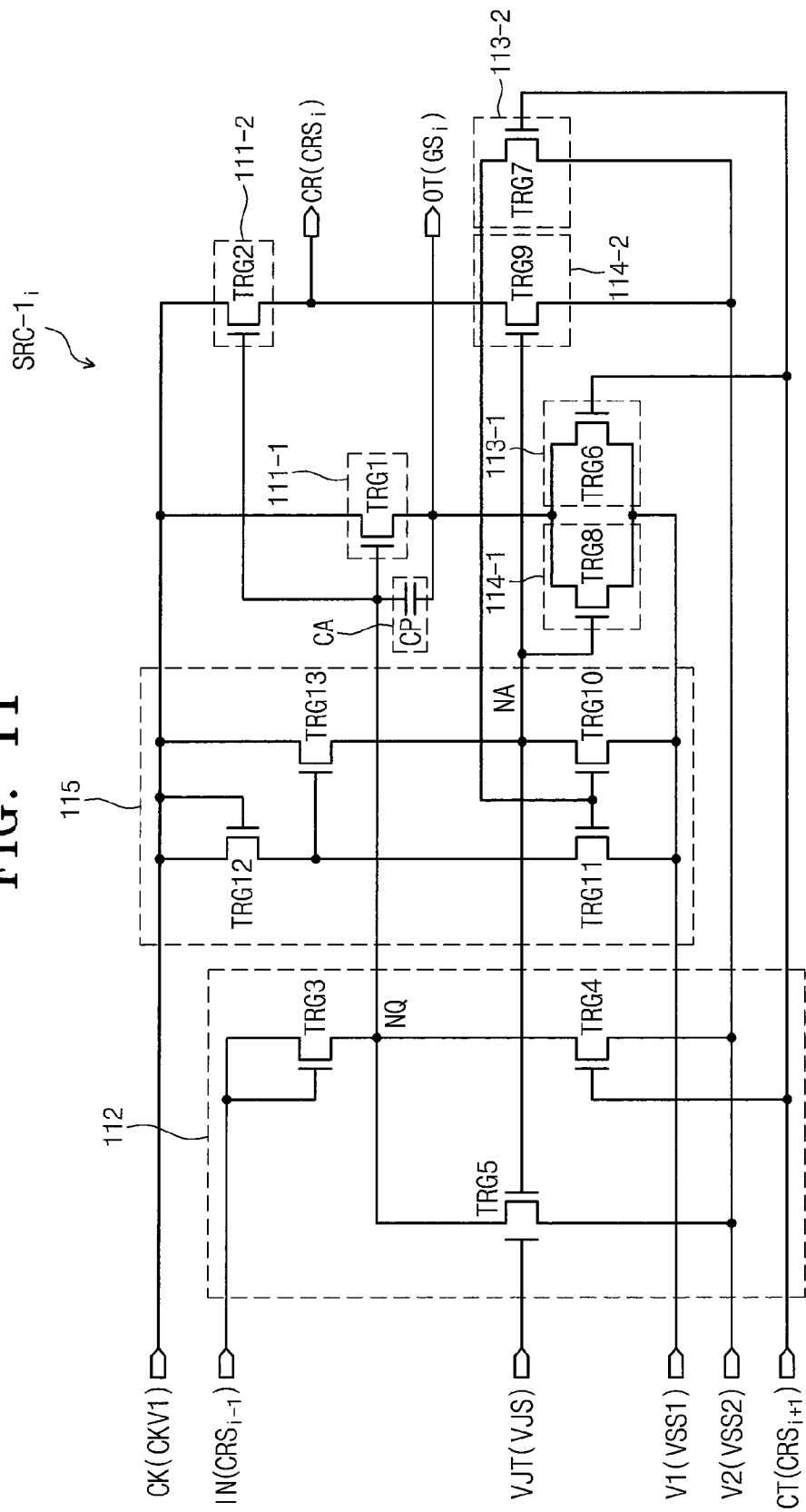
FIGS. 11-12 are circuit diagrams illustrating an ith stage among a plurality of stages included in a gate driving circuit according to an embodiment of the inventive concept.
Figure 12:
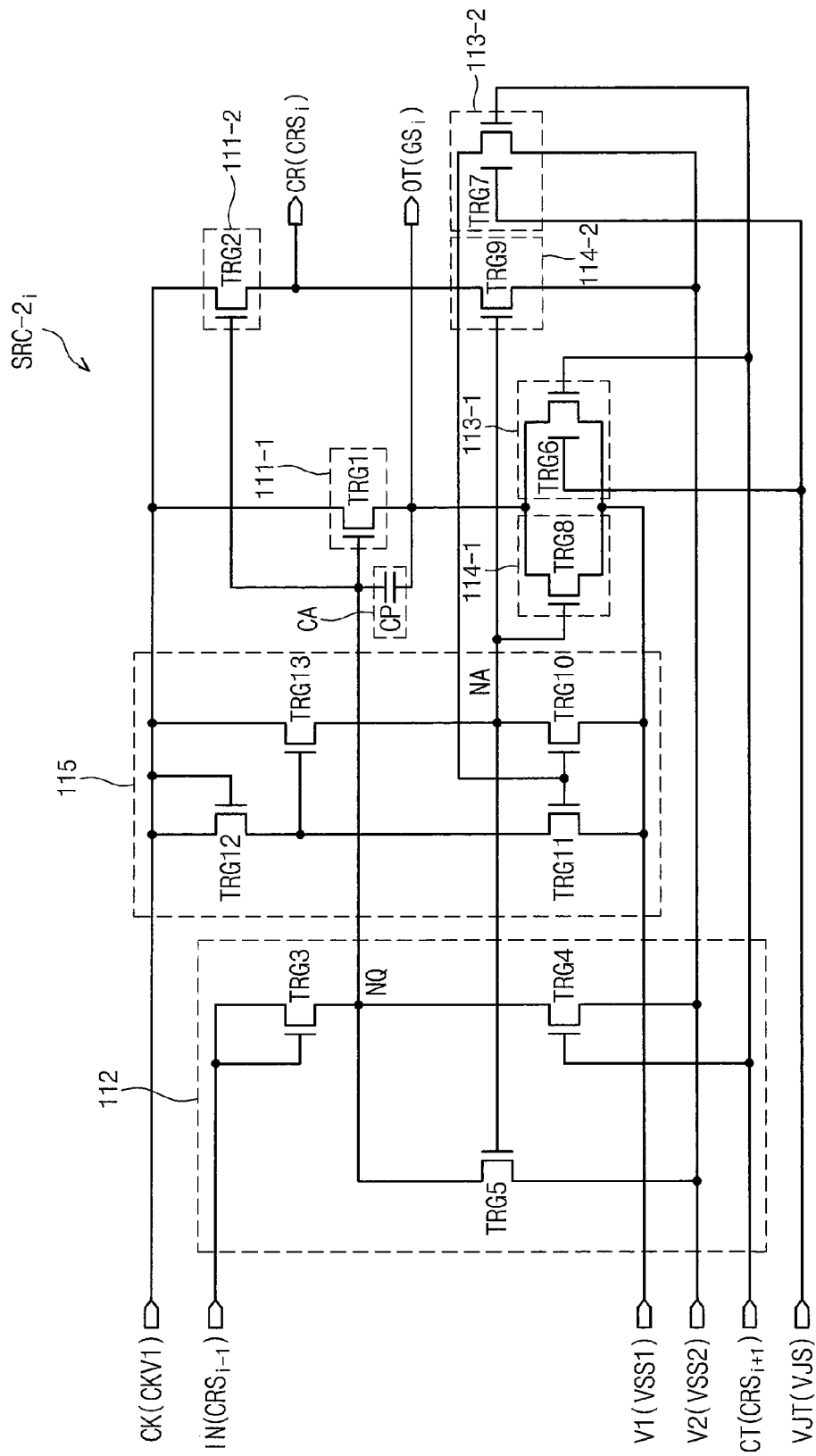

FIGS. 11 and 12 are circuit diagrams illustrating an ith stage SRC-1i or SRC-2i among a plurality of stages included in a gate driving circuit 100 according to an embodiment of the inventive concept.

FIG. 11 is a circuit diagram of an ith stage SRC-1i according to an embodiment of the inventive concept. Unlike the ith stage SRCi shown in FIG. 6, in relation to the ith stage SRC-1i shown in FIG. 11, the control unit 112 instead of the second holding unit 114-2 includes a double gate transistor.

The third control transistor TRG5 of the control unit 113 includes a first control electrode connected to the A-node NA, a second control electrode connected to the image determination terminal VJT, an input electrode connected to the second voltage input terminal V2 to receive the second low voltage VSS2, and an output electrode connected to the Q-node NQ.

When the image determination signal VJS having the second image determination voltage VJ-S is applied to the second control electrode of the third control transistor TRG5, the third control transistor TRG5 provides the second low voltage VSS2 to the Q-node NQ. Accordingly, a voltage of the Q-node NQ does not become the first boosting voltage VQ1 or the second boosting voltage VQ2, so that the first output transistor TRG1 and the second output transistor TRG2 may not be turned off.

In the still image display section F-S, the gate signal GSi has the gate-low voltage VL-G and the carry signal CRSi has the carry-low voltage VL-C, and in such a way, power consumed by the display device DD may be reduced by controlling the stages SRC1 to SRCn of the gate driving circuit 100.

Descriptions for the other parts are identical or substantially identical to those of FIG. 6 and thus are omitted.

FIG. 12 is a circuit diagram of an ith stage SRC-2i according to an embodiment of the inventive concept. Unlike the ith stage SRCi shown in FIG. 6, in relation to the ith stage SRC-2i shown in FIG. 11, the first pull-down unit 113-1 or the second pull-down unit 113-2 instead of the second holding unit 114-2 includes a double gate transistor.

The first pull-down transistor TRG6 includes a first control electrode connected to the control terminal CT to receive the carry signal CRSi+1 of the (i+1)th stage, a second control electrode connected to the image determination terminal VJT, an input electrode connected to the first voltage input terminal V1 to receive the first low voltage VSS1, and an output electrode connected to the gate output terminal OT.

When the image determination signal VJS having the second image determination voltage VJ-S is applied to the second control electrode of the first pull-down transistor TRG6, the first pull-down transistor TRG6 provides the first low voltage VSS1 to the gate output terminal OT. Accordingly, the gate signal GSi has the gate-low voltage VL-G in the still image display section F-S.

The second pull-down transistor TRG7 includes a first control electrode connected to the control terminal CT to receive the carry signal CRSi+1 of the (i+1)th stage, a second control electrode connected to the image determination terminal VJT, an input electrode connected to the second voltage input terminal V2 to receive the second low voltage VSS2, and an output electrode connected to the carry output terminal CR.

When the image determination signal VJS having the second image determination voltage VJ-S is applied to the second control electrode of the second pull-down transistor TRG7, the second pull-down transistor TRG7 provides the second low voltage VSS2 to the carry output terminal CR. Accordingly, the carry signal CRSi has the carry-low voltage VL-C in the still image display section F-S.

In such a way, power consumed by the display device DD may be reduced by controlling operations of the stages SRC1 to SRCn in the gate driving circuit 100.

Descriptions for the other parts are identical or substantially identical to those of FIG. 6 and thus are omitted.

According to the above-described embodiments of the inventive concept, while a still image is displayed, power consumed by a display device may be reduced.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although the exemplary embodiments of the present invention have been described, it is understood that the present invention should not be limited to these exemplary embodiments but various suitable changes and modifications can be made by one ordinary skilled in the art within the spirit and scope of the present invention as define by the following claims and equivalents thereof.

What is claimed is:

1. A display device comprising:
a display panel comprising a plurality of gate lines, a plurality of data lines, and a plurality of pixels connected to the plurality of gate lines and the plurality of data lines, the display panel being configured to display a video or a still image;
a gate driving circuit comprising a plurality of stages configured to output a plurality of gate signals having a gate-on voltage and a gate-off voltage less than the gate-on voltage to the gate lines, at least one of the plurality of stages comprising a double gate transistor comprising an input electrode, an output electrode, a first control electrode, and a second control electrode;
and an image determination circuit configured to output an image determination signal to the second control electrode of the double gate transistor,
wherein when the display panel displays the video, the image determination signal has a first image determination voltage and when the display panel displays the still image, the image determination signal has a second image determination voltage greater than the first image determination voltage,
wherein when the image determination signal has the second image determination voltage, the double gate transistor is turned on, so that a plurality of gate signals outputted from a plurality of stages connected in cascade to a stage comprising the double gate transistor among the plurality of stages have the gate-off voltage.

2. The display device of claim 1, wherein the second image determination voltage is about 15 V or more and about 35 V or less, and the first image determination voltage is about −12 V or more and about −6 V or less.

3. The display device of claim 1, wherein an ith stage (i being an integer greater than one) among the plurality of stages comprises:
a first output circuit configured to be turned on/off according to a voltage of a Q-node and to generate a gate signal of the plurality of gate signals outputted to a gate output terminal of the ith stage from a clock signal applied to an input terminal of the ith stage;
a second output circuit configured to be turned on/off according to the voltage of the Q-node and to generate a carry signal outputted to a carry output terminal of the ith stage from the clock signal, the carry signal having a carry-on voltage and a carry-off voltage less than the carry-on voltage;
a controller configured to control the voltage of the Q-node;
a first pull-down circuit configured to provide a first low voltage to the gate output terminal to pull down a voltage of the gate signal to a gate off-voltage after the gate signal having the gate-on voltage is outputted to the gate output terminal;

a second pull-down circuit configured to provide a second low voltage to the carry output terminal to pull down a voltage of the carry signal to the carry-off voltage after the carry signal having the carry-on voltage is outputted to the carry output terminal;
a first holding circuit configured to be turned on/off according to a voltage of an A-node and to provide the first low voltage to the gate output terminal after the first low voltage is provided to the gate output terminal;
a second holding circuit configured to be turned on/off according to the voltage of the A-node and to provide the second low voltage to the carry output terminal after the second low voltage is provided to the carry output terminal; and
an inverter configured to control the voltage of the A-node.

4. The display device of claim 3, wherein the gate-off voltage is substantially equal to the first low voltage, and the carry-off voltage is substantially equal to the second low voltage.

5. The display device of claim 4, wherein the first low voltage is about −8 V or more and about −6 V or less, and the second low voltage is about −12 V or more and about −10 V or less.

6. The display device of claim 3,
wherein the second pull-down circuit comprises the double gate transistor, and
wherein the output electrode of the double gate transistor is connected to the carry output terminal, and the first control electrode of the double gate transistor is connected to the Q-node.

7. The display device of claim 3,
wherein the controller comprises the double gate transistor, and
wherein the output electrode of the double gate transistor is connected to the Q-node and the first control electrode of the double gate transistor is connected to the A-node.

8. The display device of claim 3,
wherein the first holding circuit comprises the double gate transistor,
wherein the output electrode of the double gate transistor is connected to the gate output terminal, and
wherein the first control electrode of the double gate transistor is configured to receive a gate signal or carry signal outputted from an (i−1)th stage of the plurality of stages.

9. The display device of claim 3,
wherein the second holding circuit comprises the double gate transistor,
wherein the output electrode of the double gate transistor is connected to the carry output terminal, and
wherein the first control electrode of the double gate transistor is configured to receive a gate signal or carry signal outputted from an (i+1)th stage of the plurality of stages.

10. A display device comprising:
a display panel comprising a plurality of gate lines, a plurality of data lines, and a plurality of pixels connected to the plurality of gate lines and the plurality of data lines, the display panel being configured to display a video or a still image; and
a gate driving circuit comprising a plurality of transistors and configured to output a plurality of gate signals to the plurality of gate lines,
wherein at least one of the plurality of transistors is a double gate transistor comprising an input electrode, an output electrode, a first control electrode, and a second control electrode,
wherein the input electrode of the double gate transistor is configured to receive a low voltage less than about 0 V, and
wherein when the display panel displays the still image, the second control electrode of the double gate transistor is configured to receive a still image determination voltage is applied to turn on the double gate transistor.

11. The display device of claim 10, wherein when the display panel displays the video, a video determination voltage less than the still image determination voltage is applied to the second control electrode.

12. The display device of claim 11, wherein the low voltage less than about 0 V is about −12 V or more and about −6 V or less.

13. The display device of claim 12, wherein the still image determination voltage is about 15 V or more and about 35 V or less, and the video determination voltage is about −12 V or more and about −6 V or less.

14. The display device of claim 10, wherein the gate driving circuit comprises a plurality of stages configured to output the plurality of gate signals to the gate lines and connected in cascade,
wherein an ith stage (i being an integer greater than one) among the plurality of stages comprises:
a first output circuit configured to be turned on/off according to a voltage of a Q-node and to generate a gate signal of the plurality of gate signals outputted to a gate output terminal of the ith stage, the gate signal having a gate-on voltage and a gate-off voltage less than the gate-on voltage from a clock signal applied to an input terminal of the ith stage;
a second output circuit configured to be turned on/off according to the voltage of the Q-node and to generate a carry signal outputted to a carry output terminal of the ith stage, the carry signal and having a carry-on voltage and a carry-off voltage less than the carry-on voltage from the clock signal;
a controller configured to control the voltage of the Q-node;
a first pull-down circuit configured to provide a first low voltage to the gate output terminal to pull down a voltage of the gate signal to a gate off-voltage after the gate signal having the gate-on voltage is outputted to the gate output terminal;
a second pull-down circuit configured to provide a second low voltage to the carry output terminal to pull down a voltage of the carry signal to the carry-off voltage after the carry-on voltage is outputted to the carry output terminal;
a first holding circuit configured to be turned on/off according to a voltage of an A-node and to provide the first low voltage to the gate output terminal after the first low voltage is provided to the gate output terminal;
a second holding circuit configured to be turned on/off according to the voltage of the A-node and to provide the second low voltage to the carry output terminal after the second low voltage is provided to the carry output terminal; and
an inverter configured to control the voltage of the A-node.

15. The display device of claim 14, wherein the gate-off voltage is substantially equal to the first low voltage, and the carry-off voltage is substantially equal to the second low voltage.

16. The display device of claim 14,
wherein the second pull-down circuit comprises the double gate transistor, and
wherein the low voltage less than about 0 V applied to the input electrode of the double gate transistor is substantially equal to the second low voltage, the output electrode of the double gate transistor is connected to the carry output terminal, and the first control electrode of the double gate transistor is connected to the Q-node.

17. The display device of claim 14,
wherein the controller comprises the double gate transistor, and
wherein the low voltage less than about 0 V applied to the input electrode of the double gate transistor is substantially equal to the second low voltage, the output electrode of the double gate transistor is connected to the Q-node, and the first control electrode of the double gate transistor is connected to the A-node.

18. The display device of claim 14,
wherein the first holding circuit comprises the double gate transistor,
wherein the low voltage less than about 0 V applied to the input electrode of the double gate transistor is substantially equal to the first low voltage, the output electrode of the double gate transistor is connected to the gate output terminal, and
wherein the first control electrode of the double gate transistor is configured to receive the gate signal or the carry signal outputted from an (i+1)th stage of the plurality of stages.

19. The display device of claim 14,
wherein the second holding circuit comprises the double gate transistor,
wherein the low voltage less than about 0 V applied to the input electrode of the double gate transistor is substantially equal to the first low voltage, the output electrode of the double gate transistor is connected to the carry output terminal, and
wherein the first control electrode of the double gate transistor is configured to receive the gate signal or the carry signal outputted from an (i+1)th stage of the plurality of stages.

20. A display device comprising:
a display panel comprising a plurality of gate lines, a plurality of data lines, and a plurality of pixels connected to the plurality of gate lines and the plurality of data lines, the display panel being configured to provide an image during a frame section comprising a plurality of frames, wherein the frame section comprises a first section where a data voltage applied to the plurality of data lines is constant at each of a plurality of continuous frames and a second section where a data voltage applied to the plurality of data lines is changed at each of a plurality of continuous frames;
a gate driving circuit comprising a plurality of transistors and configured to output a plurality of gate signals to the plurality of gate lines,
a data driving circuit configured to output data signals to the plurality of data lines; and
an image determination circuit configured to output an image determination signal having a still image determination voltage in the first section and a video determination voltage less than the still image determination voltage in the second section,
wherein at least one of the plurality of transistors is a double gate transistor comprising an input electrode, an output electrode, a first control electrode and a second control electrode,
wherein the input electrode of the double gate transistor is configured to receive a low voltage less than about 0 V, and
wherein the second control electrode of the double gate transistor is configured to receive the image determination signal.

* * * * *